United States Patent [19]
Yagi

[11] Patent Number: 6,013,573
[45] Date of Patent: Jan. 11, 2000

[54] METHOD OF MANUFACTURING AN AIR BRIDGE TYPE STRUCTURE FOR SUPPORTING A MICRO-STRUCTURE

[75] Inventor: Takayuki Yagi, Yokohama, Japan

[73] Assignee: Canon Kabushiki Kaisha, Tokyo, Japan

[21] Appl. No.: 08/804,407

[22] Filed: Feb. 21, 1997

[30] Foreign Application Priority Data

Feb. 23, 1996 [JP] Japan ................................. 8-061874

[51] Int. Cl.$^7$ ............................................. H01L 21/764
[52] U.S. Cl. ........................................ 438/619; 438/421
[58] Field of Search .................................. 428/699, 700, 428/701; 438/597, 618, 619, 421, 622; 257/276, 522, 778

[56] References Cited

U.S. PATENT DOCUMENTS

| | | | |
|---|---|---|---|
| 4,289,846 | 9/1981 | Parks et al. | 430/314 |
| 4,671,852 | 6/1987 | Pyke | 156/652 |
| 4,808,549 | 2/1989 | Mikkor et al. | 437/60 |
| 5,181,874 | 1/1993 | Sokolich et al. | 445/24 |
| 5,198,385 | 3/1993 | Devitt et al. | 437/51 |
| 5,219,713 | 6/1993 | Robinson | 430/314 |
| 5,321,685 | 6/1994 | Nose et al. | 369/126 |
| 5,408,742 | 4/1995 | Zaidel et al. | 29/846 |
| 5,453,404 | 9/1995 | Leedy | 437/203 |
| 5,510,645 | 4/1996 | Fitch et al. | 257/522 |
| 5,585,722 | 12/1996 | Hosoki et al. | 324/318 |
| 5,658,698 | 8/1997 | Yagi et al. | 430/11 |

OTHER PUBLICATIONS

"Microelectronics and nanometer Structures", Journal of Vacuum Science & Technology B, Second Series, vol. 9, No. 6, Submicron Si trench profiling with an electron–beam fabricated atomic force microscope tip, Lee, Kam L., et al.

"Operation of Microfabricated Harmonic and Ordinary Side–Drive Motors", Mehregany, Mehran, et al.

"Micro Electro Mechanical Systems", "A First Functional Current Excited Planar Rotational magnetic Micromotor", Guckel, et al., IEEE Catalog No. 93CH3265–6.

"Micro Electro Mechanical Systems", "Dry Releasing of Electroplated Rotational and Overhanging Structures", Hirano, et al., IEEE Catalog No. 93CH3265–5.

"Micro Electro Mechanical Systems", "An Integrated Lateral Tunneling Unit", Kobayashi, et al., IEEE Catalog No. 92CH3039–2.

"Micro Electro Mechanical Systems", "Micromachined Integrated Optics for Free–Space Interconnections", Lin, et al., IEEE Catalog No. 95CH35754.

(List continued on next page.)

*Primary Examiner*—Timothy Speer
*Assistant Examiner*—Stephen Stein
*Attorney, Agent, or Firm*—Fitzpatrick, Cella, Harper & Scinto

[57] ABSTRACT

An air bridge type structure of a bridge shape which joins to a substrate or micro-structure is manufactured by forming an air bridge type structure on a first substrate and transferring the air bridge type structure to a second substrate and/or a micro-structure formed on the second substrate. A mold substrate, comprising a recessed portion provided on the surface of the mold substrate and a peeling layer formed on the recessed portion, is used for formation of the air bridge type structure. A micro-structure can be supported by the air bridge type structure, for example, a probe for detecting tunneling current or micro-force, supported by the air bridge type structure. Accordingly, electrical connection between structures and the substrate or between the structures one to another can be performed, even if there is undercutting underneath the structures. Film stress generated upon formation of air bridge type structures can be avoided, and increasing of productivity and lowering of costs can be simultaneously achieved.

5 Claims, 10 Drawing Sheets

OTHER PUBLICATIONS

"Microfabrication of cantilever styli for the atomic force microscope", Journal of Vacuum Science & Technology, Second Series, vol. 8, No. 4.

N.C. Tien et al., "Surface–Micromachined Mirrors for Laser–Beam Positioning", Proceedings of the 8th International Conference on Solid State Sensors and Actuators, 1995, pp. 352–355.

H. Guckel et al., "Micro Electromagnetic Actuators Based on Deep X–Ray Lithography", Proceedings of the International Symposium on Microsystems, Intelligent Materials and Robots 1995, Sendai, Japan, pp. 21–24.

METHOD OF MANUFACTURING AN AIR BRIDGE TYPE STRUCTURE FOR SUPPORTING A MICRO-STRUCTURE

BACKGROUND OF THE INVENTION

1. Field of the Invention

The present invention relates to a method of manufacturing an air bridge type structure for supporting a micro-structure fabricated by means of micro-mechanics, and to a mold substrate suitable for use therein, and to an air bridge type structure and a micro-structure using the same and also a probe for detecting tunneling current or micro-forces, using the same.

2. Related Background Art

In recent years, micro-mechanics technology has given rise to consideration of micro-machines having small movable mechanisms. Particularly, multiple small micro-machine parts can be fabricated on a substrate with high reproducibility, owing to micro-structures being fabricated using semiconductor integrated circuit formation technology (the semiconductor photolithography process). Accordingly, the arraying, and lowering of costs there, have become relatively simple, and responsivity higher than that of conventional machine structures can be expected due to the miniaturization thereof. Surface micro-machining which uses a sacrificial layer is a type of semiconductor photolithography micro-mechanics technology which enables the fabrication of wobble motors, linear micro-actuators, and the like; various devices have been developed using this process.

There are four typical methods for surface micro-machining using a sacrificial layer, as described below.

A first method involves a poly-silicon film, SOI (Si on Insulator) film, or the like to be fabricated into a micro-structure, in which film thin-film formation is performed on a silicon substrate over a silicon dioxide film thereon. This film is patterned into a desired form, following which the silicon dioxide film is removed by means of an aqueous solution of hydrofluoric acid. Linear actuators having a tunneling tip (D. Kobayashi et al., "An Integrated Lateral Tunneling Unit", Proceedings of the IEEE Micro Electro Mechanical Systems Workshop 1992, pp 214–219) and the like can be manufactured with this method. FIGS. 1A to 1E illustrate an overview of this process. First, sequential layering is performed on a substrate 512 of a silicon dioxide film 511 which serves as a sacrificial layer, a poly-silicon film 513 which becomes the structure, and a nickel mask layer 514 (FIG. 1A), following which the poly-silicon film 513 is worked using the nickel mask layer 514 as a mask, thus forming a micro-structure of the poly-silicon film 513 (FIG. 1B). The nickel mask layer 514 is then removed (FIG. 1C), following which the silicon dioxide film 511 is etched by means of an aqueous solution of hydrofluoric acid, and a micro-structure B separated from D by a gap is formed using side etching of the silicon dioxide film underneath the above structure (FIG. 1D). Vapor deposition of a metal film 515 is performed by sequential layering of Cr and Au on the surface of the structure (FIG. 1E), thus fabricating a micro-structure having electroconductivity.

The silicon dioxide film supporting the undersides of the micro-structures A and C shown in FIG. 1D is etched back, so that the structures A and C form an overhang (beam forms) over the substrate D. Accordingly, as shown in FIG. 1E, there is no electrical connection between the structures and the substrate, or between the two structures A and C, even after vapor deposition of the metal film 515 is performed. As such, multi-layered wiring (which would be desirable for simplification of the number of wires upon the substrate) is difficult, thus making miniaturization of the device difficult.

A second method involves forming a micro-structure layer on a silicon substrate and using undercutting by etching the Si substrate underneath the micro-structure so as to cut the micro-structure away from the substrate. Micro-motors (T. Hirano et al., "Dry Releasing of Electroplated Rotational and Overhanging Structures", Proceedings of the IEEE Micro Electro Mechanical Systems Workshop 1993, pp 278–283) and the like can be fabricated using this method, wherein the silicon substrate is used as a sacrificial layer.

With this method, the silicon substrate supporting the micro-structure underneath is etched back, so that the structures form an overhang (beam form) over the substrate. Accordingly, electrical connection between the structures and the substrate, or between the structures is difficult.

A third method involves a process of sequentially layering a sacrificial layer of silicon oxide film and a poly-silicon film which becomes the micro-structure layer. The poly-silicon film is patterned into a desired form, following which the silicon oxide film is removed by means of an aqueous solution of hydrofluoric acid. This fabrication method allows for fabrication of wobble micro-motors (M. Mehregany et al., "Operation of Microfabricated Harmonic and Ordinary Side-Driven motors", Proceedings IEEE Micro Electro Mechanical Systems Workshop 1990, pp 1–8), micro-mirrors (N. C. Tien et al., "Surface-Micromachined Mirrors for Laser Beam Positioning", Proceedings of the 8th Int. Conf. on Solid State Sensors and Actuators, 1995, pp 352–355), micro-optical benches (L. Y. Lin et al., "Micromachined Integrated Optics for Free-Space Interconnections", Proceedings of the IEEE Micro Electro Mechanical Systems Workshop 1995, pp 77–82), and the like.

As an example, FIGS. 2A to 2F illustrate the method of fabrication of a hinge portion for a micro mirror. A silicon nitride film 611 is formed on a substrate 610, and thereupon are conducted the sequential steps of forming a first sacrificial layer 612, a first structure layer 613, a second sacrificial layer 622, and a second structure layer 623, and patterning thereof (FIG. 2A).

Next, a silicon oxide film serving as a third sacrificial layer 632 is formed (FIG. 2B) and patterned, thus forming the third sacrificial layer 632 (FIG. 2C). Then, a poly-silicon film 625 is formed (FIG. 2D) and patterned, thus forming a third structure layer 633 (FIG. 2E). Subsequently, the first, second, and third sacrificial layers are removed by means of etching, thus forming an air bridge type hinge 650 which supports across a gap mirrors 640 connected to a slider 630 (FIG. 2F). Finally, metal film serving as a mirror reflecting film is formed.

Regarding the method of fabricating air bridge type structures such as hinges or the like wherein the above substrate and structures are fixed mechanically, or wherein the structures are fixed one to another mechanically, film formation to the side wall of trench formations can be performed by forming the sacrificial layers and the structure layers by means of CVD (Chemical Vapor Deposition) method, thus facilitating mechanical or electrical connections of the substrate and the structures or of the structures one to another.

However, in -the event that a sacrificial layer and a structure layer is to be formed of the overhanging structure shown in FIGS. 1A to 1E, the sacrificial layer and structure layer also are undesirably formed on the back surface of the beams of the structures A and C, and the structural layer on the back surface of the beams cannot be removed. Accordingly, the device must be designed so that there is no undercutting of the underside of the structure layer. Also, in FIGS. 2A to 2F, heat processing is applied to the first and second structure layers upon formation of the third sacrificial layer and third structure layer. Due to this, there is the possibility that the film stress of the first and second structure layers may change and the structure layers may bow following removal of the sacrificial layer, making film stress monitoring and film stress control accompanying the monitoring crucial.

A fourth method involves forming the structures on a substrate having a sacrificial layer, using X-ray lithography processing and electroplating film formation. This is a method for forming micro-actuators ideal for electromagnetism driving, such as micro-motors (T. Guckel et al., "A First Functional Current Exited Planar Rotational Magnetic Micromotor", Proceedings of the IEEE Micro Electro Mechanical Systems Workshop 1993, pp 7–11) and linear actuators (T. Guckel et al., "Micro Electromagnetic Actuators Based on Deep X-Ray Lithography", Proceedings of the International Symposium on Microsystems, Intelligent Materials and Robots 1995, Sendai, Japan, pp 21–24), and the like.

This method enables the formed micro-structure to have a higher degree of precision and a higher aspect ratio than that of the aforementioned three other methods. However, with this method, electrode formation on the side walls of the structure, and multi-layered wiring comprising electrode wiring between structures is difficult. Accordingly, in the event that an electromagnetic coil is to be formed, methods have been used such as using wire bonding for inter-structure electrical connections or winding the coil beforehand and assembling afterwards. Consequently, it becomes difficult to have a high concentration of wiring, and also, productivity is low.

SUMMARY OF THE INVENTION

Accordingly, it is an object of the present invention to provide a method of manufacturing an air bridge type structure for supporting a micro-structure, a mold substrate for use therein, and an air bridge type structure and a micro-structure using the air bridge type structure and also a probe for detecting tunneling current or micro-force using the same, by which the aforementioned problems of the above-described known art are solved, and wherein electrical connection between structures and the substrate or between the structures one to another can be performed, and also wherein electrical connection can similarly be performed regarding structures having undercutting underneath the structures, and further wherein stress generated upon formation of air bridge type structures can be avoided, and further yet wherein increasing of productivity and lowering of costs can be simultaneously achieved.

According to an aspect of the present invention, the above objects are achieved by means of a method of manufacturing an air bridge type structure of a bridge formation which joins to a substrate or micro-structure, comprising the steps of: forming an air bridge type structure on a first substrate; and transferring the air bridge type structure to a second substrate and/or a micro-structure formed on the second substrate.

According to another aspect of the present invention, the above objects are achieved by means of a mold substrate used for formation of an air bridge type structure, comprising: a recessed portion provided in the surface of the mold substrate; and a peeling layer formed on the recessed portion.

According to yet another aspect of the present invention, the above objects are achieved by means of an air bridge type structure fabricated by means of the aforementioned mold substrate.

According to a further aspect of the present invention, the above objects are achieved by means of a micro-structure supported by the aforementioned air bridge type structure.

According to a yet further aspect of the present invention, the above objects are achieved by means of a probe for detecting tunneling current or micro-force, supported by the aforementioned air bridge type structure.

These and other objects and advantages of the present invention will become more fully apparent from the following detailed description of the preferred embodiments, taken in conjunction with the accompanying drawings.

DESCRIPTION OF THE PREFERRED EMBODIMENTS

Figure 1A:
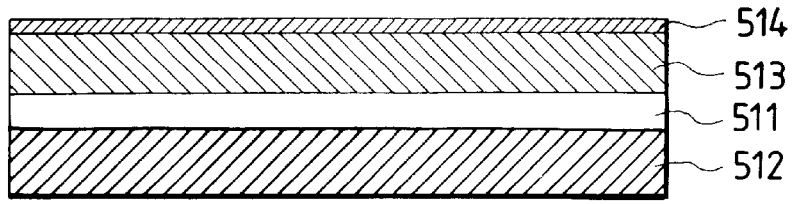
FIGS. 1A to 1E are cross-sectional drawings illustrating the principal processes of a known method of manufacturing a micro-structure.
Figure 1B:
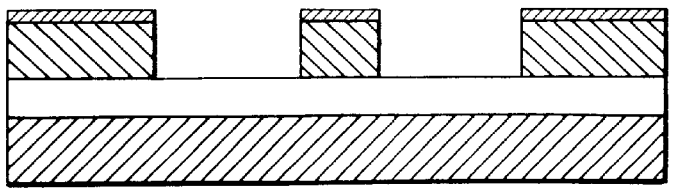
Figure 1C:
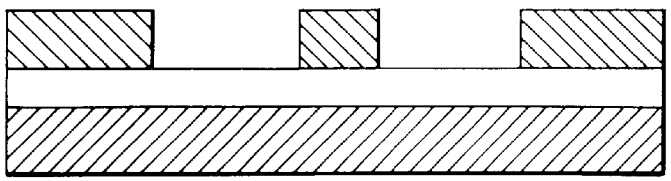

The present invention involves forming an air bridge type structure on a first substrate, and transferring the air bridge type structure to a joining layer on a second substrate and/or a micro-structure formed on the second substrate. As a result, a sacrificial layer need not be formed, and as the aforementioned transferring process facilitates formation of an air bridge type structure in an extremely easy and sure manner, productivity can be increased.

Also, the first substrate can be repeatedly used after the transferring process, so that lowering of production costs can be achieved.

The gap spacing of the air bridge is determined by the depth of the recessed portion formed on the first substrate. A single-crystalline silicon substrate is preferably used for this first substrate, being a material of which the depth of the recession can be formed with good precision, formation of fine line patterns is easy, fabrication reproducibility is high, and the cost thereof is inexpensive.

By using a single-crystalline silicon substrate for this first substrate, and forming the side wall portion of the recessed portion formed of crystal surface of (111) by means of anisotropic etching by crystallographic axis, air bridge type structures with a high degree of uniformity can be formed with excellent reproducibility in the case where a plurality thereof are formed on the same substrate. Accordingly, the method of forming the side wall portion of the recessed portion formed of crystal surface of (111) by means of anisotropic etching by crystallographic axis is preferably employed for formation of the recessed portion.

Also, according to the present embodiment, the air bridge material layer may be formed of metal. Thus, electrical connection as well as mechanical connection can be made between the structures and the substrate, or between the structures one to another. Particularly, noble metal or noble metal alloy is more preferably used as metal material comprising the air bridge material layer, due to the corrosion-resistance and high electroconductivity thereof.

After a peeling layer is formed on the first substrate including the recessed portion, upon which peeling layer the air bridge material layer is formed and patterned thus forming an air bridge type structure, the air bridge type structure is peeled off the peeling layer. Accordingly, it is important to select peeling layer material which allows for the air bridge type structure to be easily peeled, i.e., it is required that the peeling material has little reactivity with and adherence to the air bridge material.

For such material, various materials can be selected, such as metals, semiconductors, insulators, organic materials, and the like, so long as an ideal combination with the air bridge material is selected. For example, in the event that a noble metal or noble metal alloy is to be used for the air bridge material layer, oxides, nitrides, or carbides, which have little reactivity with and adherence to the air bridge material, are preferable, with examples of material which can be used including: BN, $BC_4$, AlN, $Al_2O_3$, SiC, $Si_3N_4$, $SiO_2$, TiC, TiN, $TiO_2$, $VO_2$, $Cr_2O_3$, $ZrO_2$, $Ta_2O_5$, $WO_3$, and the like. The peeling layer is formed by means of thin-film forming method so that the form of the recessed portion on the first substrate does not change markedly when the peeling layer is formed thereon. Methods preferably used for thin film forming are vacuum deposition methods with high film thickness reproducibility such as the resistance heating vapor deposition method, electron beam deposition method, CVD method, sputtering method, and the like.

In the event that silicon is used for the first substrate, silicon dioxide ($SiO_2$) can be easily obtained by means of oxidizing the surface of the substrate, and thus is ideal as a peeling layer. As for the fabrication method thereof, the method of oxidizing the surface of the silicon by means of a thermal oxidation furnace is most preferable from the view points of reproducibility, controllability, and film formation speed.

Also, since an air bridge type structure is formed by transferring as described above, the overhanging formation can be connected mechanically and electrically to the second substrate and/or a micro-structure formed on the second substrate. Further, an air bridge type structure is formed without using a sacrificial layer, so that a situation such as that illustrated in FIG. 2F regarding the formation of an air bridge type structure comprising a hinge, wherein film stress of the first and second structures change due to formation of the third sacrificial layer and third structure layer, can be avoided.

The joining layer is formed upon the substrate or upon a micro-structure; however, the joining plane of the substrate or micro-structure may be used as a joining layer for joining the air bridge type structure. Transfer of the air bridge type structure to the second substrate is performed by means of metal materials being pressed together, or by means of bonding of the metal materials being metallically bonded. In the event that the joining layer is to be formed with silicon, the joining plane of the air bridge type structure is formed of material which is capable of forming a silicide.

Known thin-film fabrication technology is used for formation of the air bridge material layer and joining layer, such as resistance heating vapor deposition method, sputtering method, chemical vapor phase growth, electroplating, or the like, and the formed films are then patterned into desired forms by means of photolithography process and etching.

The air bridge type structure according to the present invention and the manufacturing method thereof will now be described in detail with reference to the embodiments illustrated in FIG. 3A to FIG. 9.

First Embodiment

Figure 3A:
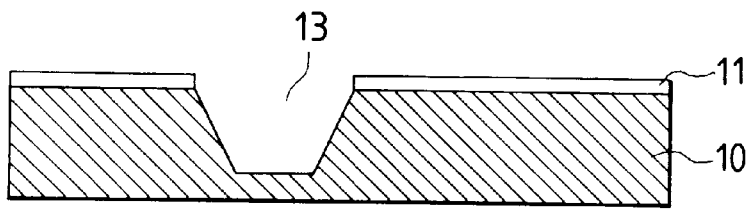
FIGS. 3A to 3H are drawings illustrating the fabrication process of a first embodiment of the method of manufacturing an air bridge type structure according to the present invention.
Figure 3B:
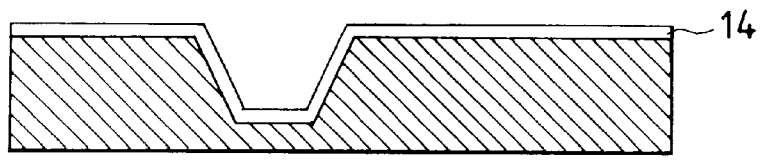
Figure 3C:
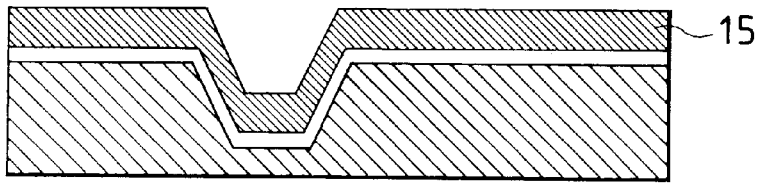
Figure 3D:
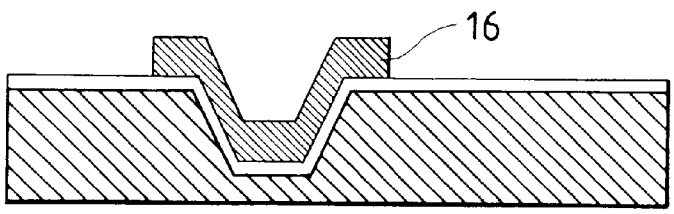
Figure 3E:
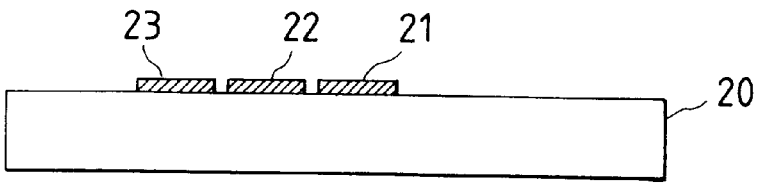
Figure 3F:
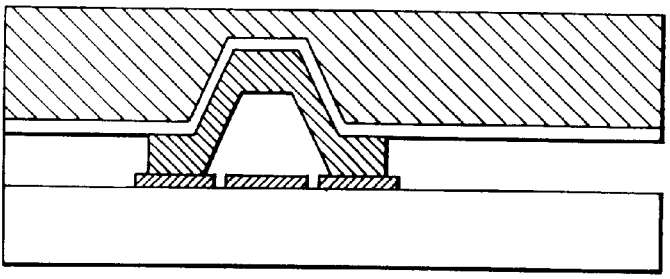
Figure 3G:
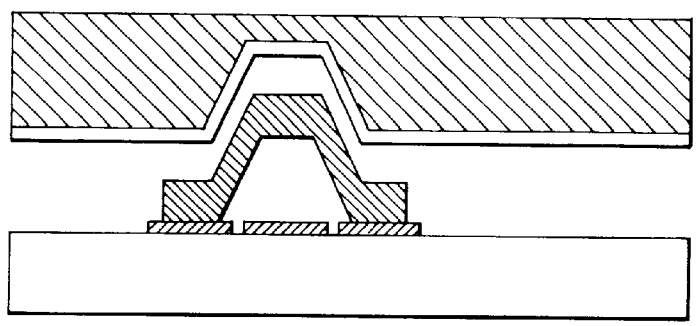
Figure 3H:
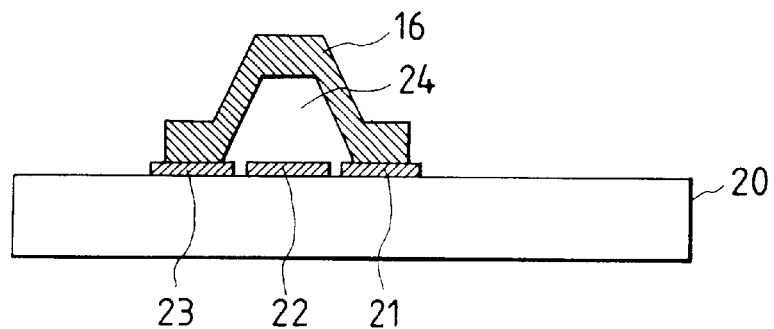
Figure 4:
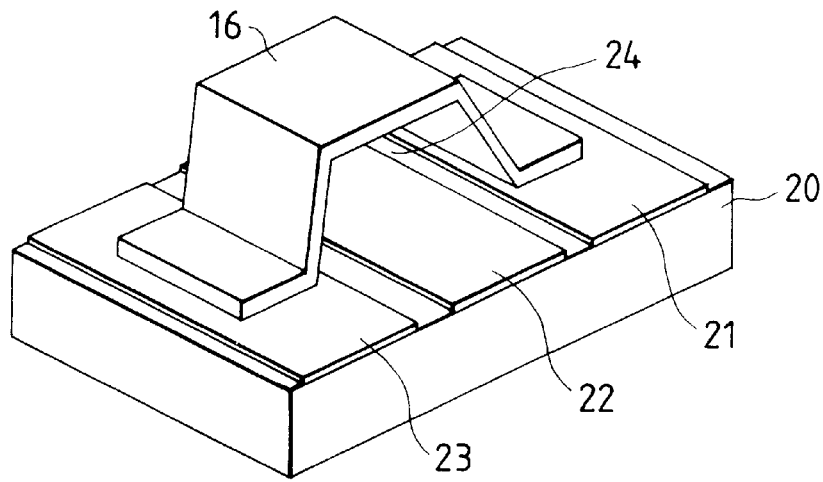
FIG. 4 is a perspective view illustrating the air bridge type structure according to the present invention.

FIGS. 3A to 3H are drawings illustrating the fabrication process of a first embodiment of the method of manufacturing an air bridge type structure according to the present invention, and FIG. 4 is a perspective view thereof. In FIG. 4, the air bridge type structure 16 is formed by being transferred onto electrode wires 21 and 23 on a substrate 20 upon which have been formed wire electrodes 21, 22, and 23, and has a gap 24 underneath the bridge. The method of forming the air bridge type structure shown in FIG. 4 will now be described with reference to FIGS. 3A to 3H.

In FIG. 3A, a silicon wafer was prepared as a first substrate 10. This silicon wafer has a crystal orientation face of <100>, and a mask layer 11 is formed thereupon, the mask layer being formed by patterning silicon dioxide formed by thermal oxidation performed by oxidative gas. Using photoresist formed by photolithography process as a mask, the mask layer 11 was etched at the desired locations by means of HF aqueous solution, thus exposing a portion of the surface of the silicon substrate. The mask layer 11 is for when the first substrate 10 is subjected to crystallographic axis anisotropic etching to form the recessed portions which become the mold substrate for the air bridge type structure, and is resistant to etching performed with crystallographic axis anisotropic etchant. After the photoresist was peeled away, the first substrate was subjected to crystallographic axis anisotropic etching in a solution of potassium hydroxide (27% by weight of KOH) at 80° C., thus forming a 5 $\mu$m deep recessed portion 13 with a base surface of a crystal plane (111) and a crystal plane (100) (FIG. 3A).

Next, following etching removal of the mask layer 11 by means of HF aqueous solution, the first substrate 10 was once more subjected to thermal oxidation by means of oxidative gas, thus forming a silicon dioxide film having a thickness of 1,000 Å on the first substrate including the recessed portion 13, this serving as a peeling layer 14 (FIG. 3B).

As shown in FIG. 3C, vacuum evaporation of Au which serves as the material to be formed into the air bridge type structure was performed, thus forming an air bridge material layer 15 having a thickness of 1 μm over the entire surface. This layer was patterned into a bridge formation by means of photolithography process and etching, thus forming the air bridge type structure 16 (FIG. 3D).

Next, a glass substrate was prepared to serve as the second substrate 20, and electrode wiring was formed thereon. First, sequential vacuum evaporation of Cr and Au was conducted to a thickness of 50 Å and 1,000 Å respectively, thus forming a thin-film deposition, which was patterned by means of photolithography process and etching, thus forming the electrode wires 21, 22, and 23 (FIG. 3E).

In the present embodiment, electrode wires 21 and 23 were used as the joining layer. Next, the air bridge type structure 16 formed on the first substrate 10 as shown in FIG. 3D, and the electrode wires 21 and 23 on the second substrate were positioned and brought into contact. Pressure was applied to the back sides of the first and second substrates upon bringing into contact, this pressurizing method causing metallic bonding of the Au serving as the probe material layer and the Au of the electrode wiring serving as the joining layer, thus joining the two together (FIG. 3F).

Subsequently, the air bridge type structure 16 is peeled away at the surface of contact between the peeling layer 15 and the air bridge type structure 16 (FIG. 3G), transferring the air bridge type structure 16 onto the electrode wires 21 and 23, thus forming the air bridge type electrode comprising the air bridge type structure 16 shown in FIG. 3H.

Observation of the air bridge type structure 16 fabricated by means of the above-described method by a SEM (Scanning Electron Microscope) showed that the air bridge type structure 16 had a replicated shape of the recessed portion formed by crystallographic axis anisotropic etching of silicon, and that the peeling had occurred at the surface of contact between the peeling layer and the air bridge type structure.

After the transferring process, film formation was conducted on the first substrate once more by means of vacuum evaporation of Au to a thickness of 1 pm, thus forming an air bridge type structure, and the air bridge type structure on a peeling layer on the first substrate was transferred to wiring on a second substrate by means of the same process as that of FIG. 3F.

Accordingly, it has been shown that the first substrate serving as a mold for the air bridge type structure can be reused. Observation of this air bridge type structure by means of a SEM showed that the form thereof was the same as that of the air bridge type structure formed before reuse of the first substrate.

The electrode wire 21 and electrode wire 23 can be electrically connected by using as connecting wire the air bridge type structure according to the present invention being fabricated of metal material. Parasitic capacity between wiring at intersections which has been a problem in conventional multi-layer wiring using an insulator layer has been diminished by means of forming the structure over a gap.

Second Embodiment

The following is a description of the fabrication process of a second embodiment of the method of manufacturing an air bridge type structure according to the present invention. For the first substrate therein, the first substrate shown in FIG. 3D which was formed according to the processes for forming an air bridge type structure according to the first embodiment illustrated in FIGS. 3A to 3D was used.

A silicon wafer was prepared to serve as the second substrate, upon the surface of which Al was deposited in a film of 1,000 Å in thickness by vacuum evaporation, which was patterned by means of photolithography process and etching, thus forming the electrode wiring which is used as the joining layer, the same as with that illustrated in FIG. 3E.

Next, the Au air bridge type structure formed on the first substrate and the Al electrode wiring on the second substrate were positioned and brought into contact. At this time, the members brought into contact were left standing in an ambient atmosphere of $N_2$ at 300° C. for one hour.

As a result, Al—Au alloy was formed on the plane of contact between the electrode wiring and the air bridge type structure, thus joining the air bridge type structure and the electrode wiring by means of an Al—Au alloy. Subsequently, the air bridge type structure was transferred onto the Al joining layer comprising electrode wiring, by means of peeling the air bridge type structure off at the surface between the peeling layer and the air bridge type structure, thus forming an air bridge type electrode.

Third Embodiment

Figure 1D:
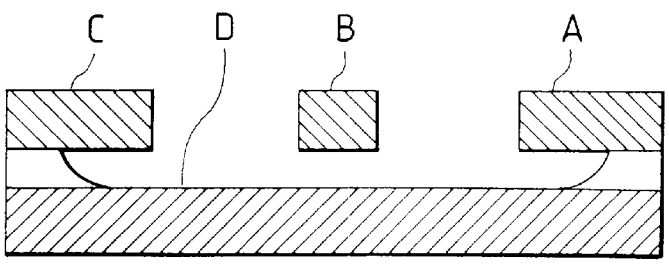
Figure 1E:
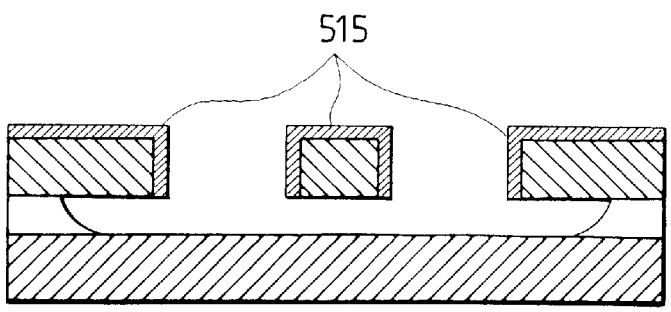

The present embodiment will be used to describe an example wherein the air bridge type structure is formed to join the micro-structure C and plane D of the substrate shown in FIGS. 1D and 1E. FIGS. 5A to 5H are drawings illustrating the fabrication process of a second air bridge type structure according to the present invention.

Figure 5A:
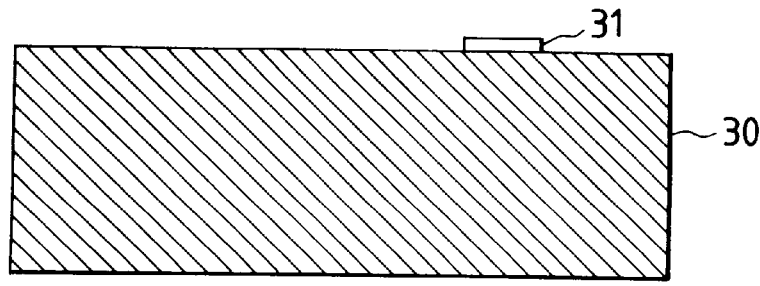
FIGS. 5A to 5H are drawings illustrating the fabrication process of a third embodiment of the method of manufacturing an air bridge type structure according to the present invention.

In FIG. 5A, a silicon wafer was prepared as a first substrate 30. This silicon wafer has a crystal orientation face of <100>, and a mask layer 31 was formed thereupon, the mask layer being formed by patterning silicon dioxide formed by thermal oxidation performed by oxidative gas. Using photoresist formed by photolithography process as a mask, the mask layer 31 was etched at the desired locations by means of HF aqueous solution, thus exposing a portion of the surface of the silicon substrate (FIG. 5A). After the photoresist was peeled away, the first substrate was subjected to crystallographic axis anisotropic etching in a solution of potassium hydroxide (27% by weight of KOH) at 80° C., thus forming a first recessed portion 32 with a base surface of a crystal plane (111) and a crystal plane (100). The depth δ1 (shown in FIG. 5B) of the first recessed portion 32 was made to be the same as the offset distance between the micro-structure C and plane D of the substrate shown in FIG. 1E.

Figure 5B:
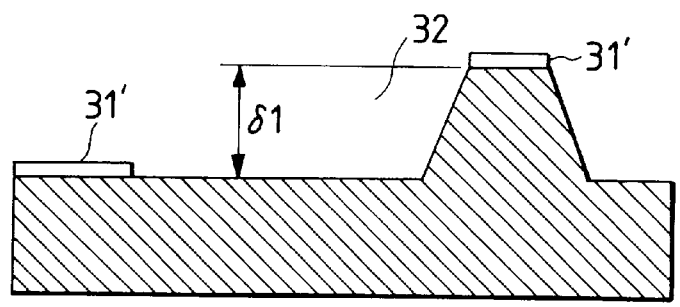
Figure 5C:
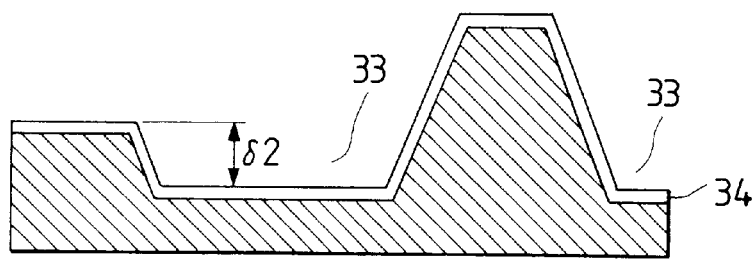

Next, following etching removal of the mask layer 31 by means of HF aqueous solution, the first substrate 30 was once more subjected to thermal oxidation by means of oxidative gas, thus forming a silicon dioxide film on the first substrate including the recessed portion 31, whereupon a mask layer 31' was formed by means of photolithography process and etching, thus exposing a portion of the surface of the silicon substrate (FIG. 5B).

Next, after the photoresist was removed, the first substrate 30 was subjected to crystallographic axis anisotropic etching in a solution of potassium hydroxide (27% by weight of KOH) at 80° C., thus forming a second recessed portion 33 with a base surface of a crystal plane (111) and a crystal plane (100). The depth δ2 (shown in FIG. 5C) of the second recessed portion 33 is provided so that the substrates themselves do not come into contact when the structure B on the first substrate is joined to the second substrate. Then, following etching removal of the mask layer 31' by means of HF aqueous solution, Cr was deposited on the first substrate 30 in a film of 900 Å in thickness by means of vacuum evaporation (FIG. 5C) so as to serve as a peeling layer 34.

Figure 5D:
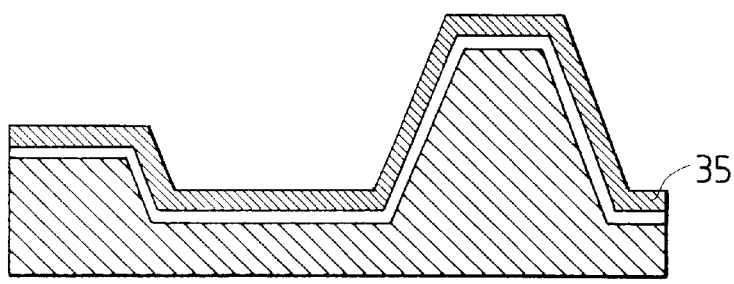
Figure 5E:
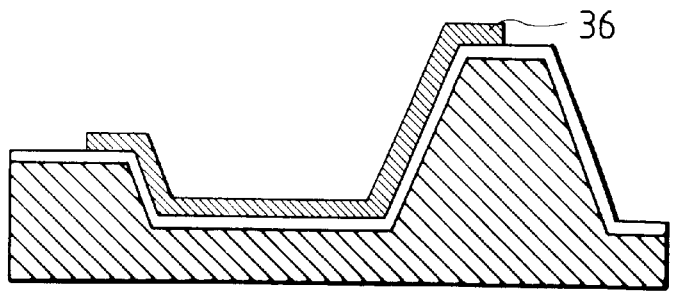

As shown in FIG. 5D, vacuum evaporation of Au which serves as the material to be formed into the air bridge type structure was performed, thus forming an air bridge material layer 35 with a thickness of 1 μm over the entire surface. This layer was patterned into a bridge formation by means of photolithography process and etching, thus forming the air bridge type structure 36 (FIG. 5E).

Figure 5F:
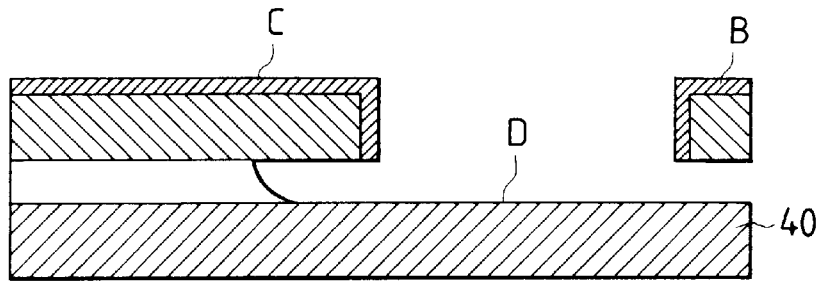
Figure 5G:
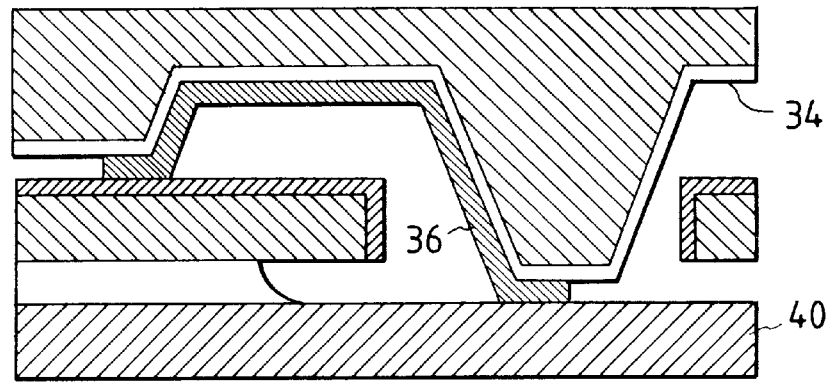
Figure 5H:
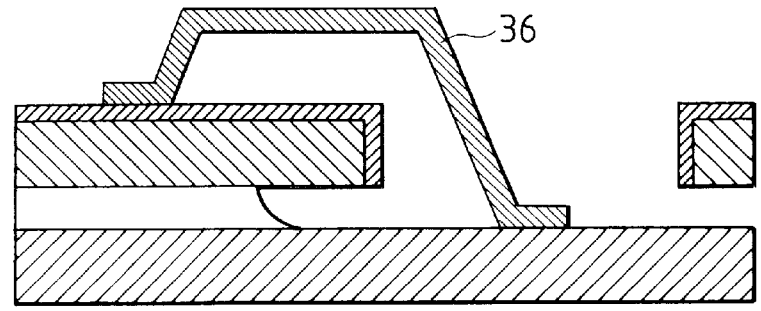

Next, the second substrate 40 upon which has been formed the structure shown in FIG. 5F was prepared (FIG. 5F is a closeup view of the left portion of FIG. 1E). Next, the air bridge type structure 36 formed on the first substrate 30 as shown in FIG. 5E, and the structure C on the second substrate and plane D of the second substrate were positioned and brought into contact. The members brought into contact were then further left standing at 100° for one hour. Pressure was applied to the first and second substrates while heating at the same time, this pressurizing method causing metallic bonding of the Au air bridge type structure 36 and the Au metal film on the structure C, and metal silicide joining of the Au air bridge type structure 36 and the plane D of the second substrate 40 (FIG. 5G). Subsequently, the air bridge type structure 36 was peeled away at the surface between the peeling layer 34 and the air bridge type structure 36, thus forming the air bridge type structure 36 shown in FIG. 5H. According to the above processes, the substrate and the structure C which has an overhanging shape (beam) over the substrate due to the silicon dioxide film underneath having been etched back were electrically connected by means of the air bridge type structure 36 according to the present invention. This allows for multi-layered wiring for simplification of the number of wires upon the substrate, thus facilitating miniaturization of the device.

Although an air bridge type structure was used in the present embodiment for connecting the substrate and the structure, it is needless to say that this also enables connection of structures one to another, such as electrical connection of the structure C and the structure A shown in FIGS. 1D and 1E. Also, regarding the second substrate, by using an Au air bridge type structure according to the present invention instead of the method described earlier as the fourth known method wherein wiring is conducted by wire bonding for the electromagnetic coil for fabricating a micro-motor, air bridge type wiring can be mounted at high density, without using assembly methods.

Observation of the air bridge type structure 36 fabricated by means of the above-described method by means of SEM (Scanning Electron Microscope) showed that the air bridge type structure 36 had a replicated shape of the recessed portion formed by crystallographic axis anisotropic etching of silicon, and that the peeling had occurred at the surface of contact between the peeling layer and the air bridge type structure.

Fourth Embodiment

Figure 2A:
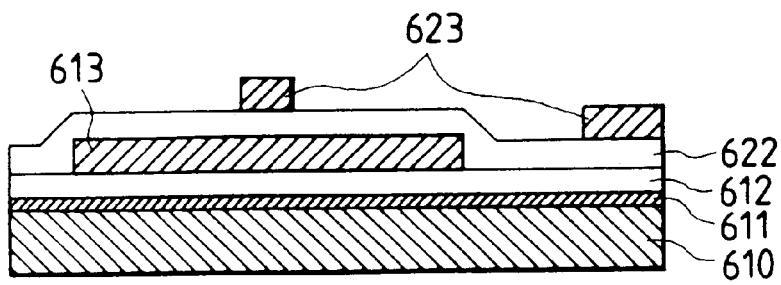
FIGS. 2A to 2F are cross-sectional drawings illustrating the principal processes of another known method of manufacturing a micro-structure.
Figure 2B:
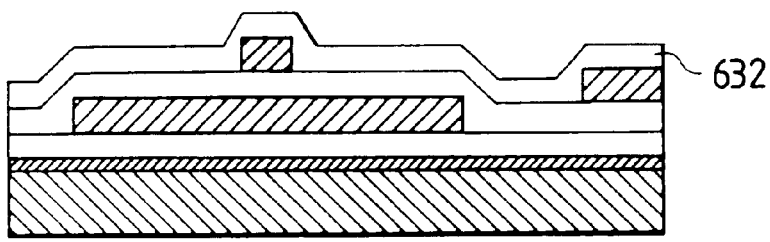
Figure 2C:
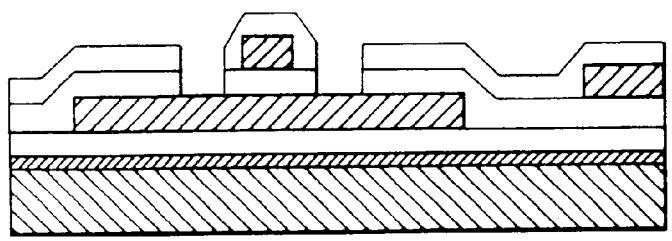
Figure 2D:
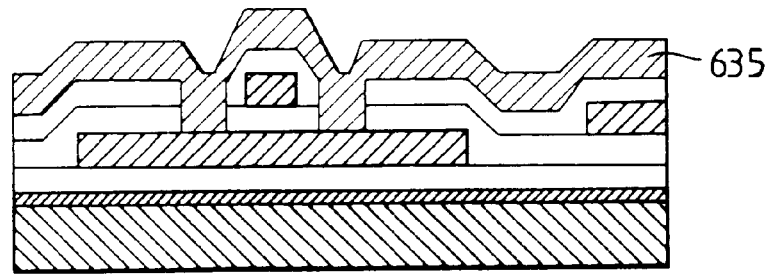
Figure 2E:
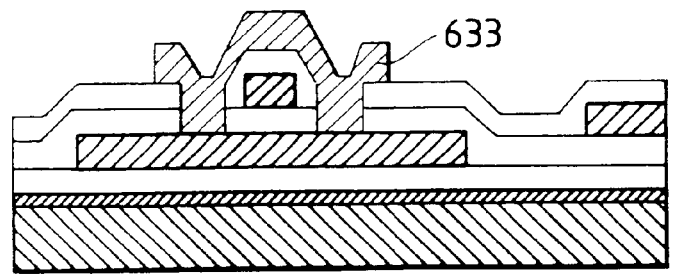
Figure 2F:
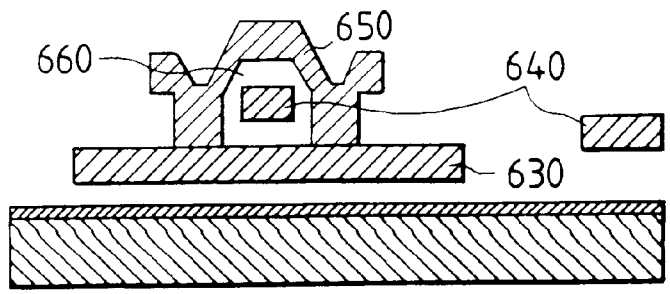

The present embodiment will be used to describe an example wherein the method for manufacturing the air bridge type structure according to the present invention is used to form the hinge of the micro-structure shown in FIG. 2F. FIGS. 6A to 6D are cross-sectional drawings illustrating the fabrication process of a second air bridge type structure according to the present invention.

Figure 6A:
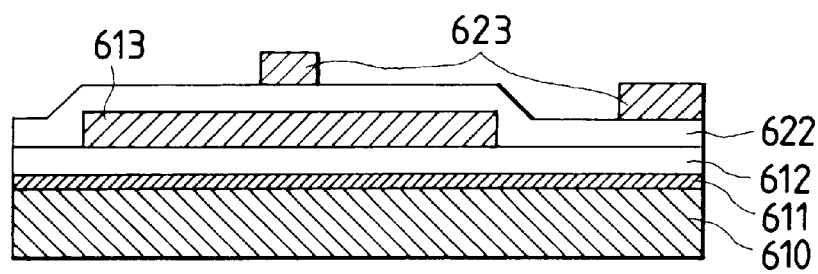
FIGS. 6A to 6D are drawings illustrating the fabrication process of a fourth embodiment of the method of manufacturing an air bridge type structure according to the present invention.
Figure 6B:
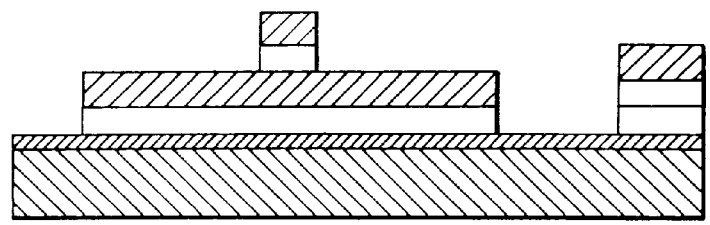
Figure 6C:
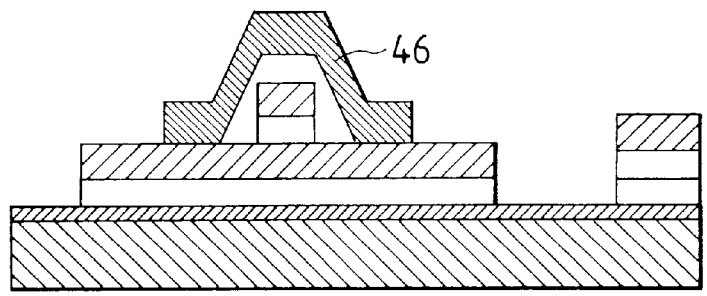
Figure 6D:
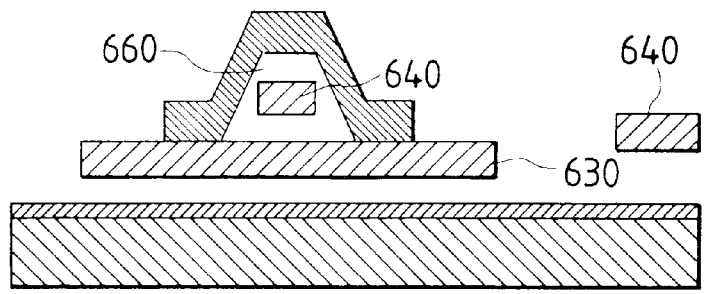

FIG. 6A same as FIG. 2A illustrates a second substrate upon which are formed first and second structure layers. First, the second sacrificial layer was etched by means of HF aqueous solution, and the surface layer of the first substrate on which the hinge is to be formed was exposed (FIG. 6B). At this time, the first sacrificial layer is also etched, but there is no problem even if the first and second sacrificial layers underneath the first and second structure layers are etched back and the structures form an overhang.

As for the first substrate for the present embodiment, the first substrate used in the process of forming the air bridge type structure according to the first embodiment, shown in FIG. 3D, was used.

The first structure layer was used as a joining layer, and the air bridge type structure formed on the first substrate as shown in FIG. 3D, and first structure layer on the second substrate shown in FIG. 6B were positioned and brought into contact. The members brought into contact were then further left standing at 100° C. for one hour. Pressure was applied to the first and second substrates while heating at the same time, this pressurizing method causing formation of silicide at the plane of contact of the Au air bridge type structure and the poly-silicon first structure layer. The air bridge type structure was peeled off at the surface between the peeling layer and the air bridge type structure, thus forming the air bridge type structure 46 serving as the hinge shown in FIG. 6C.

An air bridge type hinge which supports across a gap mirrors 640 connected to a slider 630 was formed by etching of the first and second sacrificial layers. The air bridge type structure according to the present embodiment was formed of Au by vacuum evaporation, and has excellent properties regarding electrical connection as well as supporting the mirrors mechanically.

As described above, the air bridge type structure according to the present invention can be formed by vacuum evaporation, without limitations of methods of film formation to the side walls of the trench formation, which was an important aspect conventionally, and consequently, there is no need to design the device so that there is no undercutting underneath of the structure layer, thus increasing freedom in the designing of devices.

Also, in the known method illustrated in FIGS. 2A through 2F, heat is applied to the first and second structure layers when the third sacrificial layer and the third structure layer are formed. However, according to the present invention, the hinge is formed at extremely low temperatures without forming a film over the entire surface, so that there is no change in the film stress of the first and second structure layers due to formation of the hinge.

The gap spacing shown in FIG. 2F is determined by the film thickness of the second and third sacrificial layers, so that control of film thickness of the sacrificial layers is important in formation of the hinge. However, according to the present invention, the gap spacing formed in the fabrication of micro-structures is determined by the depth of the recessed portion of the first substrate, so that making gaps becomes easier.

Fifth Embodiment

Figure 8:
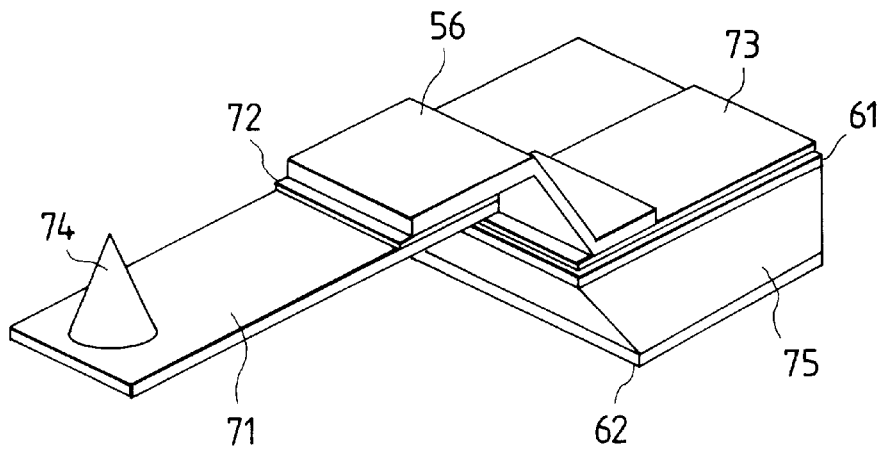
FIG. 8 is a perspective view illustrating the probe shown in the fifth embodiment according to the present invention.

The present embodiments involves fabrication of a probe for scanning tunneling microscopy (hereafter referred to as "STM") or atomic force microscopy (hereafter referred to as "AFM") comprising a thin-film cantilever of poly-silicon film and a tip provided on the cantilever, using the air-bridge type structure according to the present invention. FIG. 8 shows a perspective view of the probe fabricated.

In that Figure, reference numeral 71 denotes a cantilever, reference numeral 56 denotes an air bridge type structure, reference numeral 74 denotes a micro-probe, and reference numerals 72 and 73 denote first and second joining layers formed, respectively, on the cantilever and on silicon nitride film 61 of a silicon block 75 comprised of a second substrate. Reference numeral 62 denotes a silicon nitride film 62 used for masking the silicon wafer when etching from behind. The probe according to the present invention is of a structure such that an air bridge type structure 56 mechanically fixes a thin-film cantilever 71 having a tip 74 on the free end thereof to a silicon block 75 across first and second joining layers 72 and 73.

Figure 7A:
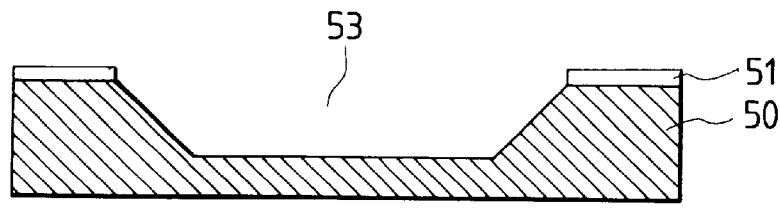
FIGS. 7A to 7K are cross-sectional drawings illustrating the fabrication process of a fifth embodiment of the method of manufacturing a probe according to the present invention.
Figure 7B:
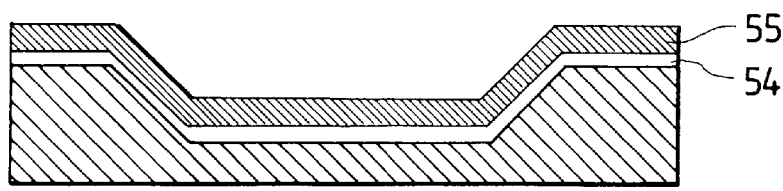
Figure 7C:
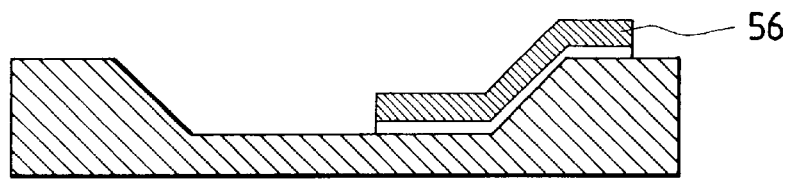

The process of forming the probe will now be described with reference to the FIGS. 7A to 7K. FIGS. 7A to 7C show the process up to the forming of an air bridge type structure 56 across of a peeling layer 54 on a first substrate 50. In FIG. 7A, a silicon wafer was prepared as a first substrate 50. This silicon wafer has a crystal orientation face of <100>, and a mask layer 51 was formed thereupon, the mask layer being formed by patterning silicon dioxide formed by thermal oxidation performed by oxidative gas. Using photoresist formed by photolithography process as a mask, the mask layer 51 was etched at the desired locations by means of HF aqueous solution, thus exposing a portion of the surface of the silicon substrate. The mask layer 51 is for when the first substrate 50 is subjected to crystallographic axis anisotropic etching to form the recessed portions which become the mold substrate for the air bridge type structure, and is resistant to etching performed with crystallographic axis anisotropic etchant. After the photoresist was peeled off, the first substrate was subjected to crystallographic axis anisotropic etching in a solution of potassium hydroxide (27% by weight of KOH) at a fluid temperature of 80° C., thus forming a 5 μm deep recessed portion 53 with a base surface of a crystal plane (111) and a crystal plane (100).

Next, following etching removal of the mask layer 51 by means of HF aqueous solution, Ag was deposited on the entire surface of the first substrate 50 including the recessed portion 53 to a thickness of 700 Å by means of vacuum evaporation to serve as a peeling layer 54. Next, Pt and Au were sequentially deposited on the entire surface to a thickness of 1 μm and 0.3 μm, respectively, by electron beam deposition method (FIG. 7B).

The air bridge structure layer 55 and peeling layer 54 were patterned into a bridge formation by means of photolithography process and etching, thus forming the air bridge type structure 56 shown in FIG. 7C on the first substrate.

Figure 7D:
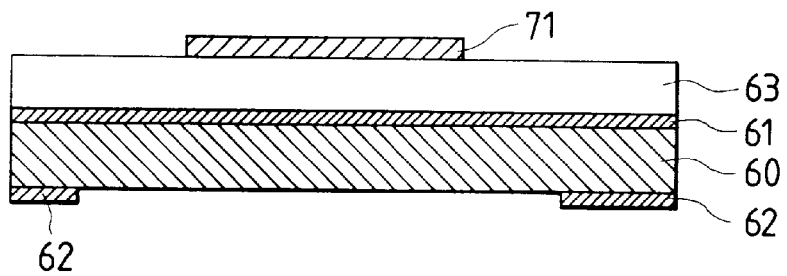

Next, a silicon wafer was prepared to serve as the second substrate 60, upon which were deposited silicon nitride films 61 and 62 to a thickness of 0.5 μm by low pressure chemical vapor deposition method (LPCVD), these films to serve as masking when conducting a later-described process of crystallographic axis anisotropic etching from the back side of the second substrate 60, and also a thin-film cantilever 71. Further, a silicon oxide film 63 with a thickness of 3 pm to serve as a sacrificial layer was formed on the silicon nitride film 61 by sputtering of a silicon dioxide target using argon ions. Next, a poly-silicon film was formed to a thickness of 1 μm by LPCVD, ion implantation of phosphorus to this poly-silicon layer was conducted, the phosphorus was diffused by thermal diffusion so as to provide electroconductivity (resistivity: 0.001 $\Omega/\square$), patterning by means of photolithography and reactive ion etching using $CF_4$ was conducted, thus forming a thin-film cantilever 71. A portion of the silicon nitride film 62 to the opposite side from where the thin-film cantilever 71 was patterned as shown in FIG. 7D by means of photolithography and reactive ion etching.

Figure 7E:
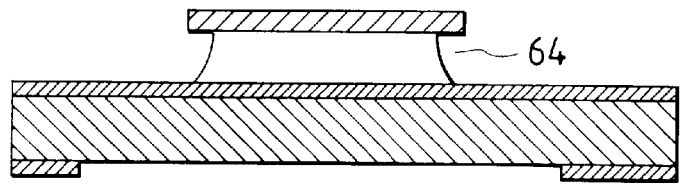

Using the thin-film cantilever as a mask, the silicon oxide film 63 was etched by means of HF aqueous solution, thus exposing the silicon nitride film 61 (FIG. 7E).

Figure 7F:
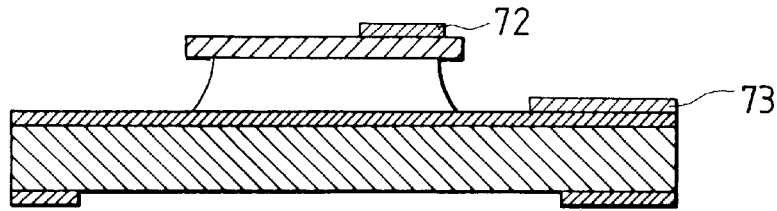

At this time, the silicon oxide film underneath the thin-film cantilever becomes an undercut formation 64 and part of the thin-film cantilever becomes a beam shape. Upon the second substrate formed in this manner was sequentially deposited Ti and Au to respective thicknesses of 150 Å and 1,000 Å over the entire surface by means of vacuum evaporation, patterning thereof was conducted by means of photolithography process and etching, thus forming a first joining layer 72 and a second joining layer 73 (FIG. 7F).

Figure 7G:
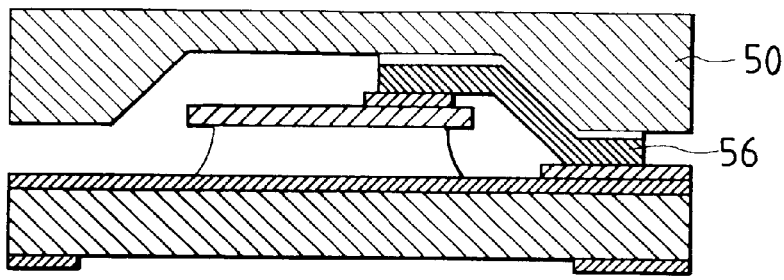

Next, the air bridge type structure 56 formed on the first substrate 50, and the first and second joining layers 72 and 73 on the second substrate 60 were positioned and brought into contact (FIG. 7G). Pressure was applied to the back sides of the first and second substrates upon bringing into contact, this pressurizing method causing metallic bonding of the Au of the air bridge type structure and the Au of the joining layers, thus joining the two together. Subsequently, the first and second substrates were peeled away at the surface of contact between the peeling layer 54 and the first substrate 50.

Figure 7H:
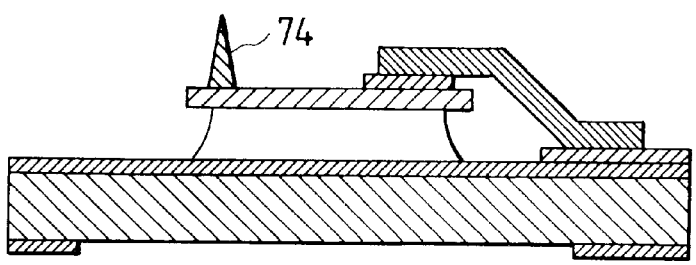

Next, the Ag serving as the peeling layer on the air bridge type structure 56 was removed by means of an aqueous solution of nitric acid, and the air bridge type structure formed of Pt and Au was transferred upon the joining layer (FIG. 7H).

Following this, a tip formed of electroconductive material was formed upon the thin-film cantilever 71. One of the methods proposed by Albrecht et al for forming a micro-probe (T. R. Albrecht, et al, "Microfabrication of Cantilever Styli for the Atomic Force Microscope", J. Vac. Sci. Technol., A8 (4), 1990, pp 3,386–3,396), a method wherein a cone-shaped stylus is formed by means of vacuum evaporation conducted through an orifice, was used. A tip was formed according to the same fabrication process except that Pt was used from the material for the tip, thus forming a micro-probe 74 as shown in FIG. 7H.

As for the method for forming the tip, the focused electron beam method (K. L. Lee, et al., "Submicron Si Trench Profiling with an Electron-Beam Fabricated Atomic Force Microscope Tip" J. Vac. Sci. Technol., B9 (6), 1991, pp 3,562–3,568) may be used for the fabrication thereof; any method may be used so long as it is capable of forming such upon the thin-film cantilever.

Figure 7I:
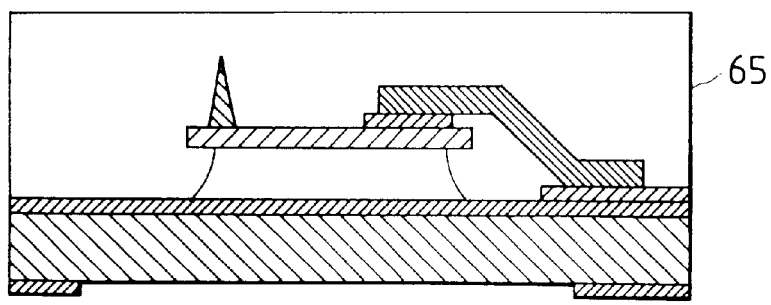
Figure 7J:
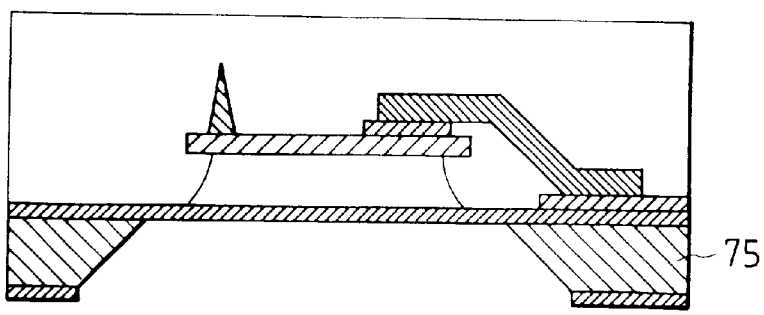
Figure 7K:
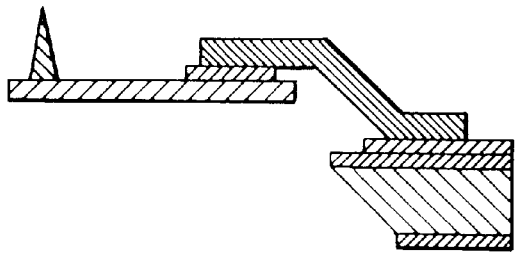

Next, a polyimide film 65 is applied to the entire upper surface of the second substrate by means of application, covering the substrate and the structures thereon as shown in FIG. 7I. Subsequently, a silicon block 75 was formed (FIG. 7J) by etching silicon from the back side of the second substrate by crystallographic axis anisotropic etching using an aqueous alkali solution comprised of ethylene diamine, pyrocatechol, and water. After this, the silicon nitride film was removed from the back side by reactive ion etching using $CF_4$, the silicon oxide film underneath the thin-film cantilever was removed by means of HF aqueous solution, and finally, the polyimide film 65 was removed by means of plasma etching using oxygen gas, thus fabricating a probe shown in FIG. 7K.

Thus, according to the above, the air bridge type structure 56 according to the present invention was used to mechanically connect a structure of a thin-film cantilever overhanging a substrate due to the silicon oxide underneath the thin-film cantilever being etched back, to the substrate.

The thin-film cantilever according to the present invention is fixed in an arrangement being hung from the upper surface thereof from the air bridge type structure 56 across a joining layer.

Accordingly, the length of the thin-film cantilever can be determined by the position at which it is supported by the air bridge type structure, and thus thin-film cantilevers having a desired spring constant and resonance frequency can be fabricated with good precision. As a result, according to the present embodiment, probes can be fabricated with high reproducibility and uniform mechanical properties such as spring constant and resonance frequency.

Figure 9:
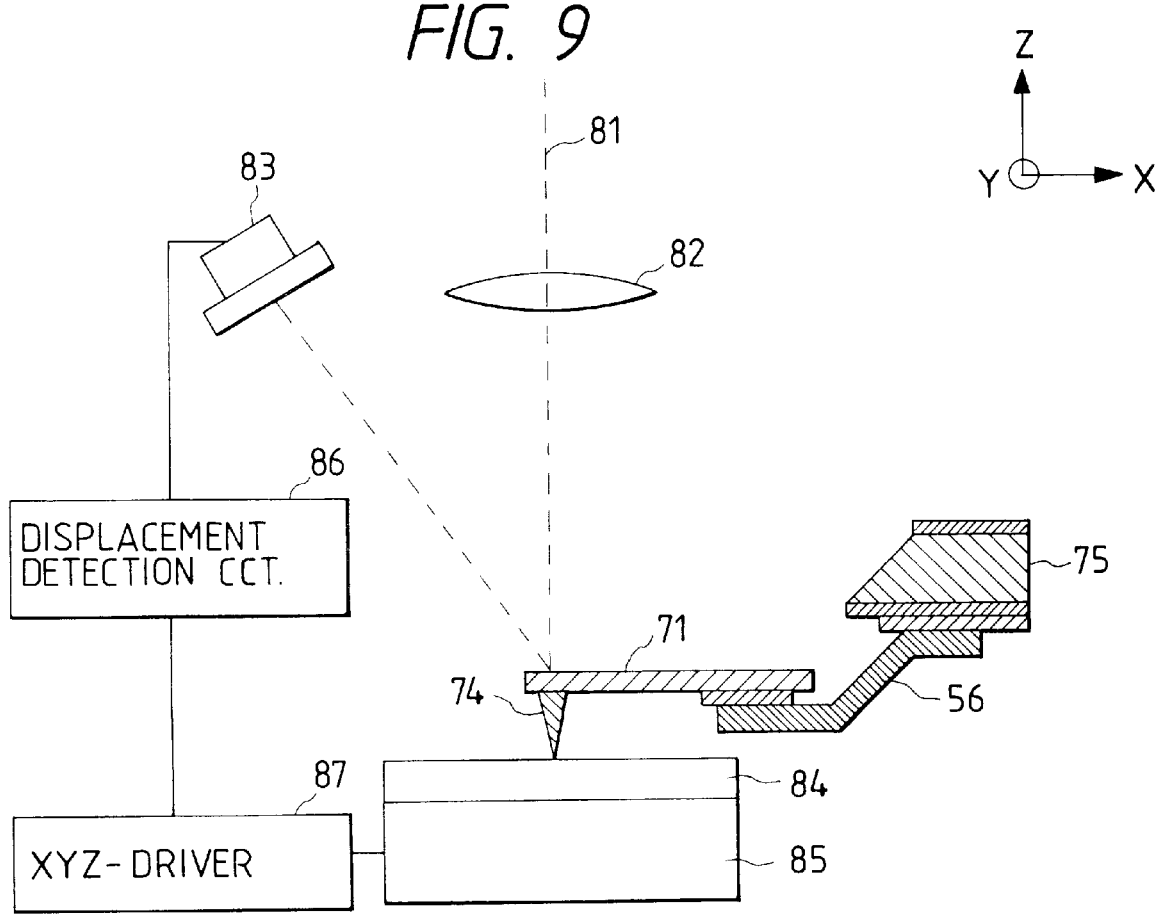
FIG. 9 is a block diagram of an AFM apparatus using the probe shown in the fifth embodiment according to the present invention.

An optical lever type AFM apparatus was fabricated using the above-described probe according to the present invention. FIG. 9 illustrates a block diagram of the present apparatus.

The AFM apparatus is comprised of the probe shown in FIG. 8, a laser beam 81, a lens 82 for converging the laser beam to the back side of the free end of the thin-film cantilever, a position sensor 83 for detecting change in the light reflection angle due to warping displacement of the thin-film cantilever, a displacement detection circuit 86 which performs displacement detection based on signals from the position sensor, and XYZ axial drive piezo device 85, and a XYZ driver 87 for driving the XYZ axial drive piezo-device in the XYZ directions. Using this AFM, the probe was brought into close proximity with a sample 84 comprised of mica, following which the XYZ axial drive piezo-device was driven in XY directions so as to observe the surface of the sample, and a step image of the surface of the mica was thus observed.

The air bridge type structure 56 according to the present invention is fabricated of electroconductive material, also serving as air bridge type wiring which enables electrical connection of the tip and the second joining layer 73. Accordingly, the probe according to the present invention may also be used for STM.

As described above, the present invention involves forming an air bridge type structure on a first substrate serving as a mold, and transferring the air bridge type structure to a second substrate and/or a micro-structure formed on the second substrate. As a result, a sacrificial layer need not be formed, and formation of an air bridge type structure can be performed in an extremely easy and sure manner.

The air bridge type structure according to the present invention has a replicated shape of the recessed portion of the mold substrate upon which a peeling layer is formed, so that form reproducibility of the air bridge type structure is high, and first substrate serving as a mold for the air bridge type structure can be reused following the transferring process, so that manufacturing cost reduction can be achieved, and productivity can be increased markedly.

Also, according to the air bridge type structure of the present invention, even with micro-structures wherein the structure forms an overhanging formation (beam) over the substrate due to the portion underneath having been etched back, a micro-structure can be mechanically connected with the substrate, and micro-structures can be mechanically connected one to another.

Further, the air bridge type structure of the present invention can be fabricated of metal material, so that air bridge type wiring can be provided at a high density between micro-structure and the substrate, as well as micro-structures one to another.

Further yet, the air bridge type structure of the present invention can be fabricated by vacuum evaporation, so that there are no restrictions regarding the method of forming film to the side walls of the trench formation, and accordingly, freedom in designing of the device is increased.

Moreover, according to the method of manufacturing the air bridge type structure of the present invention, there is no need to follow the process involved in the known method, i.e., wherein heat processing is necessary for formation of a sacrificial layer required for formation of a second structure such as a hinge. Rather, the method of manufacturing the air bridge type structure of the present invention does not require the formation of such a sacrificial layer for formation of a second structure, as the second structure is formed by other means, thus there is no change in the film stress of the first structure layer, and problems wherein the structure bows due to such change in the film stress can be avoided.

Moreover, according to the present invention, the formation of gap spacing in micro-structure formation is determined by -the depth of the recessed portion of the first substrate, accordingly making formation of the gap markedly easier.

Moreover, The thin-film cantilever supported by the air bridge type structure according to the present invention is fixed in an arrangement being hung from the upper surface thereof from the air bridge type structure across a joining layer. Accordingly, probes can be fabricated with high reproducibility and uniform mechanical properties such as spring constant and resonance frequency.

What is claimed is:

1. A method of manufacturing an air bridge type structure, comprising the steps of:

preparing a first substrate having a first region and a second region, the second region having a lower height than the first region, as measured from the first substrate;

forming a peeling layer on the first and second regions of the first substrate;

forming an air bridge material layer on the peeling layer;

patterning the air bridge material layer to form a bridge-shaped member including a first portion formed at least on the first region and a second portion formed on the second region;

bonding the first portion of the bridge-shaped member to a second substrate so that a gap spacing is formed between the second portion of the bridge-shaped member and the second substrate; and separating the bridge-shaped member from the first substrate at the peeling layer to form a n ai r bridge type structure so that the second portion of the bridge-shaped member is supported by way of the first portion, sandwiching the gap spacing between the second portion and the second substrate.

2. A method according to claim 1, wherein the bridge-shaped member is formed of a metal and wherein said step of bonding the first portion of the bridge-shaped member to the second substrate further comprises the steps of forming a joining layer formed of a metal or silicon on the second substrate and bringing the first portion of the bridge-shaped member into contact with the joining layer to join them together by metallic bonding, alloy formation or silicide formation.

3. A method according to claim 1, wherein the first substrate is prepared by forming a patterned recessed portion on a single-crystalline silicon substrate.

4. A method according to claim 3, wherein the peeling layer is formed by oxidizing a surface of the first substrate.

5. A method according to claim 3, wherein the recessed portion is formed by etching a portion of the single-crystalline silicon substrate by means of anisotropic etching.

* * * * *

UNITED STATES PATENT AND TRADEMARK OFFICE
CERTIFICATE OF CORRECTION

| | | |
|---|---|---|
| PATENT NO. | : | 6,013,573 |
| DATED | : | January 11, 2000 |
| INVENTOR(S) | : | TAKAYUKI YAGI |

It is certified that error appears in the above-identified patent and that said Letters Patent is hereby corrected as shown below:

<u>ON THE COVER PAGE:</u>

Under Column [57], in the ABSTRACT:

Line 15, "underneath" should read --beneath--.

<u>COLUMN 1</u>

Line 42, "Micro Electro" should read --Micro-Electro- --.

<u>COLUMN 2</u>

Line 11, "Micro Electro Mechanical" should read --Micro-Electro-Mechanical--;
Line 19, "structures" should read --structures,--;
Line 28, "motors," should read --Motors,--;
Line 29, "Micro Electro Mechanical" should read --Micro-Electro-Mechanical--;
Line 35, "Micro Electro" should read --Micro-Electro--;
Line 39, "micro mirror." should read --micro-mirror.--; and
Line 66, "-the" should read --the--.

UNITED STATES PATENT AND TRADEMARK OFFICE
CERTIFICATE OF CORRECTION

PATENT NO.    :   6,013,573

DATED         :   January 11, 2000

INVENTOR(S)   :   TAKAYUKI YAGI

It is certified that error appears in the above-identified patent and that said Letters Patent is hereby corrected as shown below:

COLUMN 3

Line 21, "Micro Electro" should read --Micro-Electro- --; and
    Line 23, "Micro Electromagnetic" should read --Micro-Electromagnetic--.

COLUMN 12

Line 19, "al," should read --al.,--.

UNITED STATES PATENT AND TRADEMARK OFFICE
CERTIFICATE OF CORRECTION

PATENT NO.    : 6,013,573
DATED         : January 11, 2000
INVENTOR(S)   : TAKAYUKI YAGI Page 3 of 3

It is certified that error appears in the above-identified patent and that said Letters Patent is hereby corrected as shown below:

COLUMN 14

Line 10, "The" should read --the--; and
    Line 38, "a n ai r" should read --an air--.

Signed and Sealed this

Twentieth Day of February, 2001

Attest:

NICHOLAS P. GODICI

Attesting Officer       Acting Director of the United States Patent and Trademark Office